THIN FILM TRANSISTOR ON AN INSULATING SUBSTRATE

Original Filed Jan. 15, 1965 2 Sheets-Sheet 1

INVENTOR.
PETER J. HAGON

BY Howard A Silber

ATTORNEY

THIN FILM TRANSISTOR ON AN INSULATING SUBSTRATE

Original Filed Jan. 15, 1965 2 Sheets-Sheet 2

INVENTOR.
PETER J. HAGON
BY
Howard A Silber
ATTORNEY

United States Patent Office 3,484,662

Patented Dec. 16, 1969

3,484,662

THIN FILM TRANSISTOR ON AN INSULATING SUBSTRATE

Peter J. Hagon, Corona Del Mar, Calif., assignor to North American Rockwell Corporation, a corporation of Delaware Original application Jan. 15, 1965, Ser. No. 425,694. Divided and this application May 17, 1968, Ser. No. 730,196

Int. Cl. H01l 11/00, 3/00, 5/00

U.S. Cl. 317—235 3 Claims

ABSTRACT OF THE DISCLOSURE

The invention is directed to a semiconductor device formed on a thin layer of semiconductor material which is bonded to an electrically insulating substrate. The layer of semiconductor material includes a first and second zone of one conducting type material which is separated by a third zone of opposite conductivity type material. The third zone of material forming a channel bounded by the first and second zones. A dielectric coating covers the channel and a portion of each adjacent first and second zones. Electrical contacts are connected to each of the three zones.

This application is a division of application Ser. No. 425,694, filed Jan. 15, 1965 (now abandoned).

The present invention relates to an improved semiconductor device and method of making it and more particularly to an insulated gate field effect semiconductor and the fabrication of semiconductors such as diodes and bipolar transistors in a thin, single crystal, semiconducting layer on an insulated substrate.

In such electrical translating devices the primary limitation on frequency response is the interelectrode capacitance resulting from size limitation imposed by the processes used in fabrication. Prior art processes for the fabrication of such devices have encountered production difficulties in providing a mechanically strong structure incorporating junctions having very small areas. Further, the radiation resistance characteristics of such prior art devices have suffered because of size limitation and the utilization of large masses of semiconducting material.

Therefore, it is the basic object of the present invention to provide improved methods for fabricating electrical translating devices of extremely small size thereby providing devices having high frequency response characteristics.

Therefore, it is another object of the present invention to provide improved electrical translating devices of extremely small size thereby providing devices having high frequency response characteristics.

It is another object of the present invention to provide a method for fabricating an electrical translating structure in which a thin single crystal semiconducting layer is formed on an insulating substrate and in which the conductivity of controlled portions of the layer are modified to provide devices having reproducible characteristics and high reliability.

It is a further object of the present invention to provide an improved method for fabricating a field effect transistor which has an effective channel length controllable to a fraction of a micron.

A still further object is to provide a method for fabricating an electrical translating device in a thin film single crystal semiconductor where the junction formed is normal to the single crystal surface.

Another object of the present invention is to provide a method of fabricating bipolar transistors in a single crystal semiconducting layer thereby providing a symmetrical transistor structure with a controlled width homogeneous base.

A further object of the present invention is to provide a method of fabricating a vertical junction diode having the diffused junction plane normal to the surface and effective junction areas smaller than those obtainable by conventional techniques.

A still further object is to provide a field effect transistor, diode, and bipolar transistor structure, in a thin film semiconductor and method of fabricating such structures in which the junction is formed essentially perpendicular to and extends through the entire thickness of the semiconductor material thereby substantially reducing device capacitance. The term "thin film" as used herein is defined as including a thickness range of from fifty (50) angstroms to the order of one (1) micron.

The invention in its preferred form utilizes an insulating substrate on which a thin layer single crystal semiconductor is securely bonded, preferably by epitaxial growth processes, to form one or more isolated semiconducting regions of a preselected conductivity. A protective coating is formed over preselected portions of the semiconductor and a conductivity determining dopant is preferably introduced into the exposed semiconducting material at two spaced zones adjacent opposite edges of the coating to form a field effect, diode or bipolar transistor. The introduction of the dopant by diffusion is for a time and at a temperature sufficient to insure diffusion throughout the thickness of the semiconducting layer of said zone and under the protective coating for a controlled distance. In this manner a region of controlled length is formed under the coating intermediate two zones having conductivity characteristics differing from those of the intermediate region. The junctions between the two zones and the region of different conductivity characteristics are formed normal to the plane of the single crystal layer. The intermediate region constitutes the channel of the field effect transistor, the base of the bipolar transistor and low conductivity region of the diode structure. Suitable electrical contacts are then provided in accordance with well known techniques.

The invention and the objects and features will be more apparent from the following detailed description and drawings, hereby made a part thereof, in which.

Figure 1:
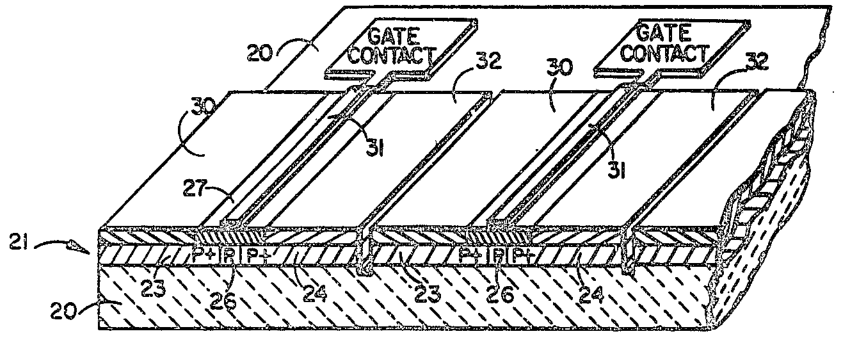
FIG. 1 shows a perspective view in partial section and partial elevation of the device fabricated in accordance with the method of the present invention.
Figure 2:
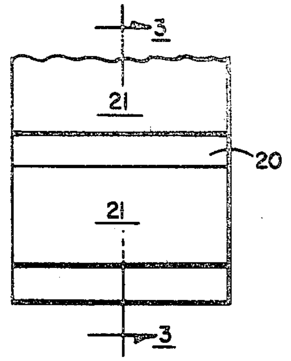
FIG. 2 is a plan view of the initial material.
Figure 3:
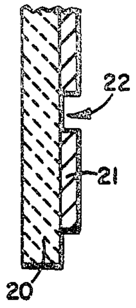
FIG. 3 is a sectional view along line 3—3 of FIG. 2.
Figure 4:
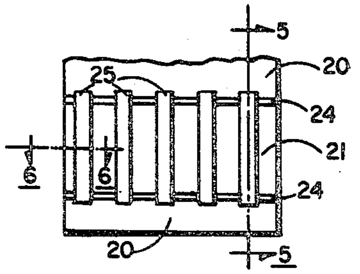
FIG. 4 is a plan view showing a semiconducting material region with appropriate masking.
Figure 5:
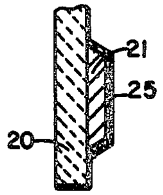
FIG. 5 is a sectional view along line 5—5 of FIG. 4.

Referring now to FIG. 1, one electrical translating device which may be fabricated in accordance with the method of the present invention is illustrated. The field effect transistor structure illustrated comprises an insulating substrate 20, e.g., sapphire, quartz, glass, ceramic, etc., on which a thin layer, about 1 micron thick, monocrystalline semiconductor 21 e.g., silicon germanium, gallium arsenide, or cadmium telluride, has been securely bonded by epitaxial growth techniques well known in the art. In the preferred embodiment the semiconductor, i.e., silicon, is of p type conductivity. As explained in detail hereinafter, zones 23 and 24 of the semiconductor 21 are changed to p-plus type conductivity while maintaining a region of channel 26 of p type conductivity separating the two zones, 23 and 24, of p-plus type conductivity. The channel 26 has a width extending across the entire width of the semiconductor 21 and may have any desired length, i.e., the distance betwen spaced zones 23 and 24 may be closely controlled as described hereinafter. The channel 26 also extends through the entire thickness of semiconductor 21 so that the junctions formed between each of the zones 23 and 24 and the channel 26 is essentially perpendicular to the plane of the thin semiconductor 21 and to substrate 20.

A dielectric or insulating coating or layer, e.g., silicon dioxide, 27 covers the channel 26 on which a gate electrode 31, e.g., aluminum, is deposited. The electrode 31 extends over the region of both junctions in the semiconductor layer 21. Electrical contacts 30 and 32 are affixed to the surfaces of areas 23 and 24, respectively.

As is well-known, a field effect transistor is operated by increasing and decreasing the length of the space charge region in the channel 26, so that an increased space charge thickness results in a decreased current flow from source 30 to drain 32. Continued increase in space charge thickness through the application of a signal to the gate contact 31 will result in the termination of such current flow at the so-called pinch-off value. Appropriate electrical components (not shown) interconnecting the gate, source and drain contacts may be provided in accordance with well-known techniques. Since the device is symmetrical the source and drain are interchangeable.

It is apparent that, although a p type channel is shown as forming a pair of junctions with spaced p-plus type semiconducting zones, other combinations of n type with p or n-plus type semiconductors may be constructed to provide spaced zones of one conductivity separated by a channel of lower conductivity.

Referring now to FIGS. 2–7, the method for forming a field effect transistor in accordance with the present invention is illustrated. Starting, for example, with a relatively massive insulating substrate body 20, e.g., sapphire, having a thickness of about 250 microns,, a very thin layer 21 of semiconducting material, e.g., single crystal silicon of the p type, is initially securely bonded to the surface of substrate 20 by vapor phase growth, evaporation, gaseous discharge, electrochemical or other techniques well known in the art. The thickness of the silicon deposited is preferably about 1.1 to 1.2 microns, although any required thickness may be utilized. The conductivity type and resistivity may be adjusted by suitable adaptation of the deposition process and/or by subsequent doping in accordance with procedures well known in the art. In the specific embodiment described the silicon had an initially uniform concentration of boron and a resistivity of about 80 ohm-cm.

The semiconducting layer 21 is polished by well-known mechanical, chemical or electrochemical techniques to a thickness of about 0.9 to 1.1 microns and preferably has an optical finish. Portions of the layer 21 are selectively removed to leave one or more longitudinally extending bars or strips of semiconducting material 21 bounded on each side by longitudinal areas of exposed substrate 20. In the preferred embodiment these bars of semiconducting material have a width of about 500 microns with adjacent spacings 22 of about 300 microns of substrate material. The removal of semiconducting material 21 to form spacings 22 of exposed substrate 20 may be achieved by suitable masking techniques using organic or inorganic masking layers in combination with appropriate chemical and electrochemical etching techniques or, alternatively, by mechanical electron beam or laser beam milling techniques. Alternatively, the material 21 may be initially formed as a bar of desired width and length. In the preferred embodiment well-known techniques such as thermally grown silicon dioxide masks combined with photoresist techniques, oxide etching and selected silicon etching were utilized.

The edges of the longitudinal extending bars of semiconducting material 21, only one bar being described in detail in FIGS. 4–7, are mechanically polished to form beveled edges 24 to facilitate subsequent processing.

A suitable masking material is then grown or otherwise deposited to the semiconducting bars 21 in the form of transverse stripes 25. The stripes 25 may be formed by thermal growth for silicon layers or by vapor growth or evaporation techniques for all semiconductor materials either by selective deposition or by area deposition and selective removal. In the single crystal-silicon sapphire-substrate example of the preferred embodiment, thermally grown silicon dioxide and standard photoresist and oxide etching techniques were utilized. The stripes 25 were about 12.5 microns in width, had a thickness of about 4000 A., and extended the entire width of the longitudinally extending semiconducting bars 21.

The purpose of the stripes 25 is to mask thin transverse sections of the semiconducting material to control the area exposed to the subsequent step of dispersing a dopant in the semiconductor 21. Therefore, the stripe material and thickness will be determined by the semiconducting material, the dopant type used and conditions applied during fabrication, as is well-known in the art.

Figure 6:
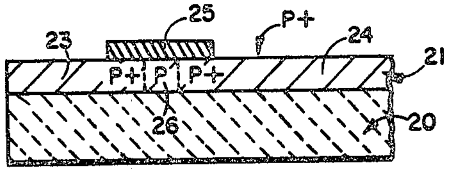
FIG. 6 is a sectional view along line 6—6 of FIG. 4.
Figure 11:
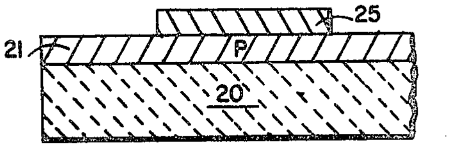
FIGS. 11–14 show sectional views of a schematic diagram of a bipolar transistor made in accordance with the present invention.
Figure 7:
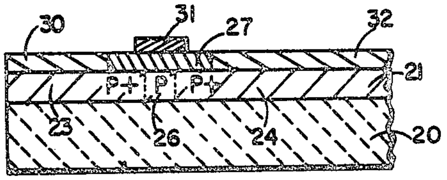
FIG. 7 shows a sectional view of a part of the final device made in accordance with the present invention.
Figure 12:
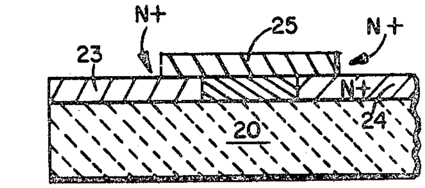

A dopant is then introduced by diffusion into the semiconducting layer 21, and under the masking stripe 25 as indicated by the arrows in FIG. 6. In the preferred embodiment boron diffusant was utilised, i.e., the diffusant was of the same type as the initial bulk dopant of the semiconductor 21, although other diffusants may be utilized as is well-known in the art. The diffusion of the dopant into the semiconductor is continued for a time and at a temperature sufficient to increase the dopant concentration through the entire thickness of the semiconductor 21 in the two zones 23 and 24 adjacent mask 25 thereby converting these zones to a p-plus conductivity type. Further, the diffusing step is maintained for sufficient time so that the dopant will diffuse longitudinally from the opposite zones 23 and 24 adjacent mask 25 to form a thin region or channel 26 under the mask 25 having a conductivity different than the adjacent areas. The distance the dopant diffuses parallel to the semiconductor surface under the mask 25 must be large compared to the thickness of the semiconductor in order to obtain a junction essentially vertical to the semiconductor surface. Thus, the diffusion is preferably maintained for sufficient time so that the dopant diffuses a distance of at least about twice the semiconductor thickness, as shown in the examples of Table I for 1 micron thick semiconductor layers.

TABLE I

| | Diffusion | | Channel Length (Approx.), microns |
|---|---|---|---|
| | Time, hrs. | Temperature, ° C. | |
| Mask Width, microns: | | | |
| (a) 12.5 | 1 | 1,200 | 6 |
| (b) 12.5 | 3 | 1,200 | 1 |
| (c) 25 | 1 | 1,200 | 19 |
| (d) 25 | 3 | 1,200 | 13 |
| (e) 25 | 8 | 1,200 | 7 |

In these examples the zones 23 and 24 of the semiconductor have a much lower resistivity than the unaffected channel 26 which maintains its original conductivity characteristics. In this manner the channel length, i.e., the distance between the adjacent zones 23 and 24 of the p-plus type conductivity, may be accurately controlled. Further, the channel 26 may be made very short regardless of the width of the masking stripe 25 by controlling the time and temperature of the diffusion step.

After diffusing for an appropriate time, the stripes 25 are removed and an insulating material 27 is grown or deposited on the semiconducting material or insulating material 27 is added to the existing stripe 25. The dielectric 27 is positioned over the channel 26 and has a width sufficient to protect the formed junction from environmental effects and to enable the later application of electrical contacts on its surface. In the embodiment described, the dielectric 27 was deposited by thermally growing silicon dioxide and standard photoresist and oxide etching techniques were used to obtain a dielectric layer having a width of about 40 microns and a thickness of 1500 to 3000 A.

A high conductivity metallic layer is then applied to the three areas to form individual source, gate and drain contacts 30, 31 and 32. This may be accomplished by selective deposition or by area deposition and selective removal techniques. In the preferred embodiment aluminum was vacuum deposited and selectively removed by photoresist and chemical etching techniques to provide a contact thickness of from about 2000 A. to about 4000 A. The gate contact 31 is preferably narrow, 12.5 microns wide, compared to the width of the dielectric material and of about the same order of magnitude as the channel length. Individual field effect transistor structures may then be isolated from each other by cutting through the source-drain contacts and semiconductor material as illustrated in FIG. 1.

Devices fabricated in accordance with the above described processes had the following characteristics: Zero gate bias source-drain currents vary from 20 microamps with a 50 micron long gate channel to 15 ma. with a 500 micron long gate channel; and transconductances vary from 12$\mu$ mhos to 5000$\mu$ mhos respectively; D.C. input resistances of greater than $10^{10}$ ohms, input capacitance varied from less than about 0.2 pf. to about 2 pf., and frequency cut-off values greater than $10^8$ c.p.s. have been measured.

Figure 8:
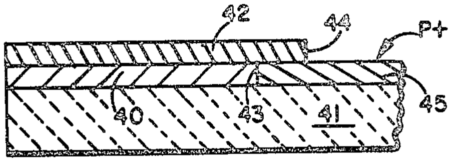
FIGS. 8–10 show sectional views of a schematic diagram of the structure of a diode made in accordance with the present invention.
Figure 13:
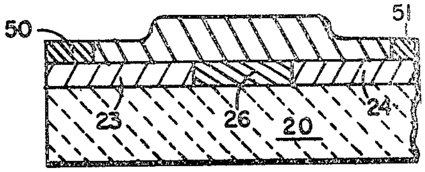
Figure 9:
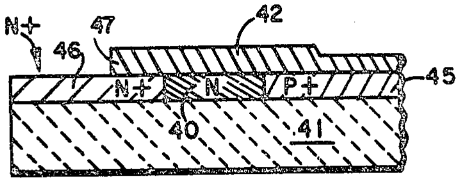
Figure 10:
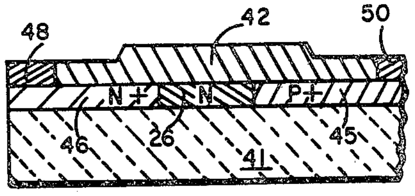

FIGS. 8–10 show schematically the process of the present invention utilized in fabricating vertical junction diffused diode structures. The starting material is 0.1 ohm-cm. N-type silicon layer 40, 0.5 micron thick, on a sapphire substrate 41, e.g., 250 microns thick, on which silicon stripes with bevelled edges are formed as described above. The stripes are oxidized, masked and etched to give at least one oxide coated portion 42 having an edge as shown in FIG. 8. FIG. 8 is a schematic section through the actual device area of the final product. A boron diffusion is then carried out into the exposed silicon area to an equivalent depth of 3 microns to form a junction 43 about 3 microns under the edge 44 of the oxide coating 42. An oxide coating is formed over the p-plus type zone 45 and masked and etched to give the oxide structure 42 shown in FIG. 9. A heavily doped N-plus diffusion, e.g., using a phosphorous dopant, is carried out to an equivalent depth of 3 microns. Since the oxide edge 47 left after the second photoresist operation is aligned to give a 12 micron spacing from the first oxide edge 44 and both diffusion depths were 3 microns, the resulting spacing between the heavily doped N-plus type zone 46 and p-plus type zone 45 is approximately 5 microns after allowing for the extra penetration of the first diffusion during the second diffusion. An oxide is then grown on the N-plus diffused zone 46, contact regions are cut in the oxide 42, and aluminum contacts 48 and 50 are applied to the heavily doped zones 45 and 46. The resulting diode transistor structure is shown in FIG. 10 and had an N-type 0.1 ohm-cm. silicon intermediate region 40 of 5 to 6 microns length with a passivating silicon dioxide layer 42.

As in the above described field effect transistor structure the diffusion is maintained for sufficient time so that the dopant diffuses a distance at least about twice the semiconductor thickness, as shown in the examples of Table II for 1 micron thick semiconductor layers.

TABLE II

| | 1st Diffusion | | 2nd Diffusion | | Distance Under Exposed Edge | | Region Width |
|---|---|---|---|---|---|---|---|
| | Time | Temp., ° C. | Time | Temp., ° C. | 1st | 2nd | |
| (a) | 5 min | 1,200 | 30 min | 1,200 | 2$\mu$ | 2$\mu$ | ~8$\mu$ |
| (b) | 5 min | 1,200 | 1 hr | 1,200 | 3$\mu$ | 3$\mu$ | ~5$\mu$ |
| (c) | 5 min | 1,200 | 2 hrs | 1,200 | 4.2$\mu$ | 4.2$\mu$ | ~4$\mu$ |
| (d) | 5 min | 1,200 | 3½ hrs | 1,200 | 5.2$\mu$ | 5.2$\mu$ | ~2$\mu$ |

Typical characteristics for diodes made in accordance with the conditions of Table II are as follows:

Forward Current (AT $V_F$=1 volt) $I_F$=1–5 ma.
Reverse Current (AT $V_R$=1 volt) $I_R$=1 na.
Diode Capacitance $C_D$=.01 pf.
Storage Time when switched from 3 ma. forward to 2 volts reverse=0.5–1.0 $\mu$sec.

Figure 14:
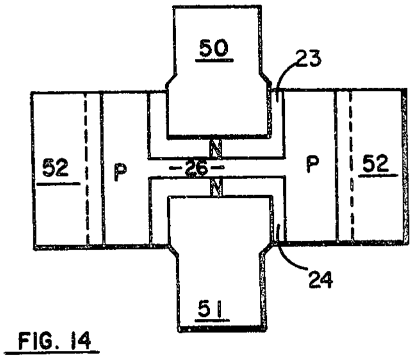

FIGS. 11–14 show schematically the process of the present invention utilized in fabricating bipolar transistor structures. The process steps and materials described above with respect to the field effect transistor structure are utilized except that an N-plus dopant, e.g., phosphorous, is preferably simultaneously introduced at each edge of the insulating coating 25. Thus, for a 1 micron thick semiconducting layer 21 or a sapphire substrate 20 having a 12.5 micron wide protective stripe 25, the diffusion into zones 23 and 24 is maintained for a time and at a temperature sufficient to allow the dopant to laterally diffuse under the edges of the coating or mask 25 for a distance of about 3 microns on each side. The resulting intermediate region of p-type conductivity is about six microns wide. An insulating layer is then added on the surface and appropriate portions removed for the application of electrical contacts 50 and 51 to the N-plus zones. FIG. 14 shows schematically a top view of the resulting structure where the dielectric coating is removed for clarity of illustration. The electrical contact(s) 52 to the p-type region is then made by standard techniques.

Examples of the conditions for fabricating bipolar transistors are shown in the following table:

TABLE III

| | Diffusion | | Intermediate Region Width, $\mu$ | Semiconductor Thickness, $\mu$ |
|---|---|---|---|---|
| | Time | Temp., ° C. | | |
| Mask Width, $\mu$: | | | | |
| 12.5 | 30 min | 1,200 | 8 | 1 |
| 12.5 | 1 hr | 1,200 | 6 | 1 |
| 12.5 | 2 hrs | 1,200 | 4 | 1 |
| 12.5 | 3½ hrs | 1,200 | 2 | 1 |

Thus, the present invention provides for the formation of a controlled channel length in a field effect diode, and bipolar transistor utilizing a thin film semiconducting layer structurally supported by and bonded to a massive block of insulating substrate, which results in significantly reduced active device areas while providing improved structural and electrical characteristics as well as reproducibility and reliability.

It is apparent that the invention has been described in terms of specific embodiments which are but illustrative and other arrangements and modifications will be apparent to those skilled in the art. For example, each of the devices produced by the process of the present invention may be fabricated individually or in arrays. Further, the diffusion in each zone may be accomplished independently by providing a protective coating over the other zone. It is also apparent that the device structures may be formed by successive diffusion under the same edge of the protective coating to form a structure in which one zone is of initial conductivity and the intermediate zone is of changed conductivity. These and other variations and modifications will be apparent to those skilled in the art. Therefore, the present invention is not limited to the specific embodiments disclosed but only by the appended claims.

I claim:

1. A field effect transistor comprising in combination an insulating substrate, a thin film semiconductor bonded to a surface of said substrate and having first and second zones of one conductivity type separated by a third zone of a different conductivity type, said zones defining respectively first and second spaced vertical junctions intersecting both surfaces of said semiconductor film, a dielectric coating covering said third region and said first and second spaced junctions and electrical contacts connected to said zones.

2. A field effect transistor comprising in combination an insulating substrate, a thin film semiconductor having one surface bonded to a surface of said substrate and having at least a first and second region of one conductivity type separated by a third region of a different conductivity type, said third region being a channel bounded by said first and second regions and by said substrate, a dielectric coating on said semiconductor surfaces covering said channel and a portion of each of said adjacent first and second regions, and electric contact means connected to each of said zones.

3. A semiconductor device comprising a thin film of semiconductive silicon on an insulating substrate including at least a first and second zone of one conductivity type separated by a third zone of opposite conductivity type, said first and second zones forming first and second spaced junctions with said third zone, said junctions passing through the entire thickness of said semiconductor material, said third zone having one side bounded by said substrate and an opposite side bounded by a dielectric layer at least coating said third zone, and separate electrical contact means on each of said first and second zones and on said dielectric layer.

References Cited

UNITED STATES PATENTS

| | | | |
|---|---|---|---|
| 3,392,056 | 7/1968 | Maskalick | 117—227 |
| 3,411,051 | 11/1968 | Kilby | 317—235 |
| 3,258,663 | 6/1966 | Weimer | 317—235 |

JOHN W. HUCKERT, Primary Examiner

M. H. EDLOW, Assistant Examiner

U.S. Cl. X.R.

148—176; 317—234